(12) United States Patent  
Copperthite

(10) Patent No.: US 6,471,116 B2
(45) Date of Patent: Oct. 29, 2002

(54) WIRE BONDING SPOOL SYSTEM

(75) Inventor: Theodore J. Copperthite, Tustin, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 14 days.

(21) Appl. No.: 09/766,287

(22) Filed: Jan. 19, 2001

(65) Prior Publication Data

US 2002/0096553 A1 Jul. 25, 2002

(51) Int. Cl.[7] .............................. B23K 31/00; B23K 1/06
(52) U.S. Cl. ...................... 228/180.5; 228/1.1; 228/4.5; 228/110.1
(58) Field of Search ........................ 228/180.5, 110.1, 228/1.1, 4.5

(56) References Cited

U.S. PATENT DOCUMENTS

| | | | | |
|---|---|---|---|---|
| 3,954,217 A | * | 5/1976 | Smith ....................... | 228/1.1 |
| 4,099,663 A | * | 7/1978 | Brill et al. ................. | 228/13 |
| 4,381,852 A | * | 5/1983 | Ferree et al. .............. | 140/92.2 |
| 4,475,681 A | * | 10/1984 | Ingle ....................... | 219/56.21 |
| 4,789,093 A | * | 12/1988 | Bansemir ................. | 219/56.21 |
| 4,907,343 A | * | 3/1990 | Dolan et al. .............. | 242/563 |
| 5,037,023 A | * | 8/1991 | Akiyama et al. .......... | 228/102 |
| 5,180,094 A | * | 1/1993 | Yanagida et al. .......... | 228/4.5 |
| 5,887,816 A | * | 3/1999 | Jones ....................... | 242/420.6 |
| 6,098,868 A | * | 8/2000 | Mae et al. ................. | 228/102 |
| 6,119,971 A | * | 9/2000 | Jones ....................... | 242/420.6 |
| 6,279,226 B1 | * | 8/2001 | Ohkubo et al. ........... | 228/180.5 |
| 6,302,317 B1 | * | 10/2001 | Narita et al. ............. | 228/179.1 |
| 6,357,649 B1 | * | 3/2002 | Okatsu et al. ............ | 228/1.1 |

* cited by examiner

Primary Examiner—Tom Dunn
Assistant Examiner—Zidia Pittman
(74) Attorney, Agent, or Firm—George F. Bethel

(57) ABSTRACT

A wire dereeler for an ultrasonic wire bonder with a bond head has a support for rotatably supporting a reel of wire driven by a stepper motor in incremental steps. Two rollers receive the wire therebetween and are driven by a motor drive for rotating or torquing the rollers and tensioning the wire placed between the rollers. A linkage generally aligns the rollers in parallel with the wire therebetween. A photoelectric sensor determines a given amount of wire at a position between the bond head and the rollers and provides a signal for controlling the stepper motor driving the reel of wire.

22 Claims, 7 Drawing Sheets

WIRE BONDING SPOOL SYSTEM

BACKGROUND OF THE INVENTION

1. Field of the Invention

The field of this invention resides within the industrial wire bonding art. More specifically, it relates to ultrasonically bonding a wire to a component such as an electrical, electronic, or semi-conductor part by an ultrasonic wire bonder. The ultrasonic wire bonder has wire fed to it from a reel which is then bonded by an ultrasonically vibratory transducer connected to a bonding tool. The invention specifically relates to providing an appropriate amount of wire to a bonder while at the same time maintaining control over the feed system to the bonder.

2. Prior Art

The prior art of wire bonding constitutes a number of wire bonders which receive large and small thickness wire to be ultrasonically bonded to a component. Such components can be electrical, electronic, or other types of components including many semi-conductor devices and processors in which a wire bonded connection must be undertaken. In such cases, wire is moved into proximity under a bonding tool with a transducer connected to it. This is done through a bonding head which moves in X, Y and Z directions.

Generally, the bonding head moves the bonding tool with the wire in proximity thereto into juxtaposition against an electrical device to be bonded. In doing so, the bonding head usually pays out a certain amount of wire from a reel.

The wire should be carefully and reliably removed from the reel or spool and then fed to the bonder as required. In some prior cases, the wire has been over fed or under fed. Such prior art dereelers created bonding problems with regard to the interaction of the bonding head, bonding tool, and movements of the bonding head.

In order to allow for a given amount of play in the wire as the bonding head moved, the prior art used a dancer-arm. This was used to tension the wire as it came off of the spool or reel as it was fed to the bonder. Because of the fact the dancer-arm provided tension through the use of a spring force it was subject to bonder induced vibrations. This created not only resistance problems but increased wear.

The system using the dancer-arm and other means for handling wire to place it in a properly fed tension mode caused the wire to break. Further to this extent, the tension required of the upstream tension on the wire provided by a spring force or dancer-arm created problems with regard to the movement of the wire on the downstream movement into the proximity of the bonding head. This led to wear problems downstream from the spring tensioners or dancer-arm. Further to this extent, the feeding of the wire to the bonding head through a tube or other feed system was such that it either could over feed or under feed the wire creating downstream problems of greater magnitude. The fundamental problems are such where the wire fed to the bonding head complicated the entire bonding operation and oftentimes was fouled, jammed, or improperly fed for a proper bond by the bonding tool.

This invention overcomes many of the drawbacks of the prior art in providing wire to a bonding head. In particular, this invention provides for proper torque and tension of the wire. It also provides for a buffer so that a proper amount of wire is always in readiness to be fed to the bonding head.

The foregoing features of the torque tension mechanism are provided by drawing the wire with a sufficient amount of tension from the wire spool. In this manner there will be a degree of pulling torque between the reel and the tensioner mechanism. This enhances the feed as well as the maintenance of the alignment of the wire coming from the reel or spool.

The buffer sensor of this invention creates a sufficient amount of wire within the entire feed system so that there is wire that can be fed without over amounts of slack. The wire to be fed is constantly monitored as to the amount of the necessary slack in the system for proper feeding to the bonding head. This constant monitoring through the buffer sensor of the invention allows for improved feeding, monitoring, and delivery of wire to the downstream end of the process namely to the bonder head.

For these reasons, the invention is a significant step over the prior art of bonding head wire dereelers for creating a wire bonding spool system and wire bonder of an improved type and capacity.

BRIEF SUMMARY OF THE INVENTION

In summation, this invention comprises a wire bonding spool system having a torque and tension mechanism for tensioning the wire from a spool or reel in conjunction with a buffer sensor which senses and causes the wire to be fed with a proper amount of feed length between an over slack condition and a tightened over tensioned condition.

More specifically, the invention comprises a dereeler and control system for dereeling or unreeling wire from a spool for, or reel of wire that is to be bonded by a bonding head. The spool of wire is driven by an incremental movement of a motor which releases the wire on a basis of the required amount of wire.

In order to maintain tension between the spool and the feed system, a positive torque or tension mechanism is utilized comprising a pair of rollers that are driven by a motor. The rollers maintain positive tension on the wire being fed from the reel. At the same time, the roller axes are maintained in generally parallel relationship to each other. This allows for variously sized wire to be fed there through across a broad spectrum of thickness and width across the dimensions of the reel or spool from which the wire is fed.

The buffer sensor senses a certain amount of wire that is being fed. The buffer sensor incorporates a light responsive output reflected from the wire which is being fed. The wire being fed is passed through an opening, throat, or monitoring passage. As the wire passes with either undo slack or undo tension, the sensor puts out a signal that appropriately controls the feed of the wire from the reel.

The dereeler in combination with the bonding head also incorporates pinch rollers to properly feed the wire while at the same time monitoring the amount of wire that is being fed. This helps to assure the fact as to whether or not a proper bond has been undertaken downstream while at the same time monitoring the length of wire.

As will be seen from the following specification, this invention is a significant step over the art of providing wire to a wire bonder.

DESCRIPTION OF THE PREFERRED EMBODIMENTS

Figure 1:
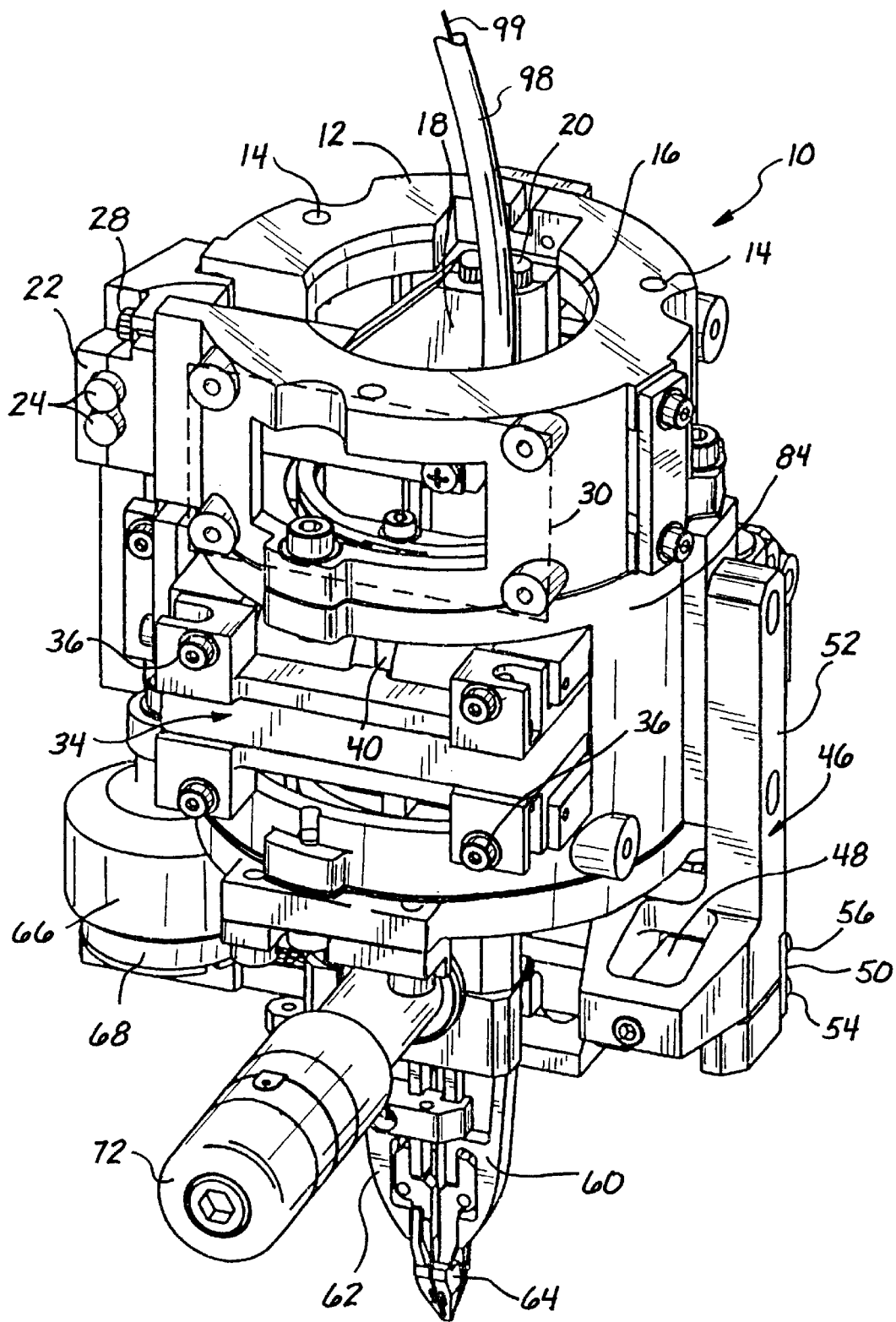
FIG. 1 shows a perspective view of a wire bonding head with wire bonding elements at the lower end and an attachment collar for attachment to the support tube of the bonder for use with the dereeler or wire bonding spool system of this invention.
Figure 2:
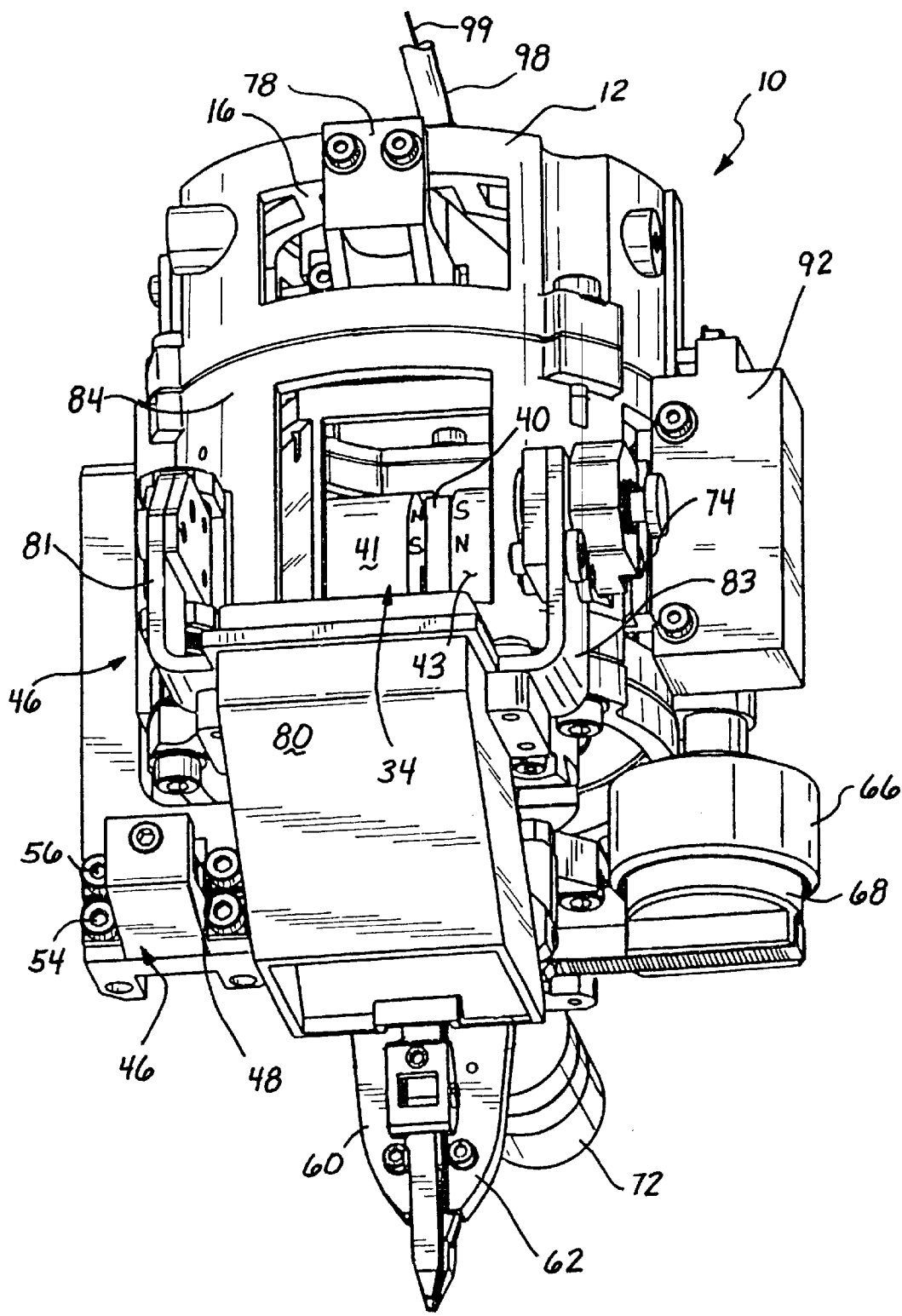
FIG. 2 shows a perspective view opposite from that of FIG. 1.

Looking more particularly at FIGS. 1 and 2, it can be seen that the large wire bonder or bonding head that is used with the bonding spool system of this invention has been shown. The bonding head is attached to the bonder equipment and moves by means of a Z direction support tube to move in a vertical upright direction or rotationally. The Z tube control connection moves the bonding head with respect to its location over an ultrasonic bond that is to take place. The bond head also moves in X & Y directions. The work is stationary during bonding.

In particular, the bonding head 10 has been shown having a casting, collar, or upper cylinder 12 that specifically has tapped openings 14. The tapped openings 14 secure the bonding head to the Z tube (i.e. upright connection) of a bonder in order for it to move over the surface of the area on which an ultrasonic bond is to take place. Fundamentally, the casting 12 is a mounting bracket or mounting member. It can be configured in any particular manner so long as it attaches to the Z tube which moves the bonding head upwardly and downwardly, rotationally, and in other modes. The bonding head Z tube connection can also move in an X-Y direction in this case.

An opening 16 is shown within the bonding head which receives a cable guide 18 having cables 20 which serve the electronic and control functions of the bonding head. A second cable guide 22 is shown in which cables 24 which are the same as cables 20 emanate from.

The cable guide can be mounted by a mounting screw 28 and the cables can be interconnected to a circuit board generally dotted in as circuit board 30. The circuit board 30 provides for the controls through various integrated circuits and other control functions in concert with the signals and power provided through the cables including cables 20 and 24. The circuit board 30 can be a printed circuit board and junction board, and have various electronic functions provided thereon for the bonding head.

In order to drive the bonding tool and other elements with sufficient force against the work to be bonded, a forcer assembly 34 is shown. The forcer assembly 34 includes mounting screws such as screws 36 to secure it to the bonder head. The forcer magnetically drives the bonding tool into forced relationship on the work at a pre-established or desired level of force. This is provided by a magnet seen as magnet 40. coils 41 and 43 on either side are also shown that provide the force to the magnet 40 to drive it downwardly.

In order to provide for active pushing or lateral movement of the cutter against the bonding tool, a pusher assembly, arm, or active pusher 46 is shown which has a piezoelectric stack 48 for providing the pushing force. This is done at a flexure or spring member 50 that is shown connected to the fixed portion of the pusher assembly 46 namely upper portion 52 to which the flexure is connected by screw 56 to the moving part by screw 54. The piezoelectric stack 48 expands and then movement is returned by forced spring movement.

The bonder head incorporates a moving clamp arm 60 for clamping the wire with a fixed clamp arm 62. A wire guide 64 for guiding the wire is shown.

Looking more particularly at FIGS. 1 and 2, it can be seen that a permanent magnet 66 with a coil 68 has been shown. The permanent magnet 66 and the coil 68 articulate the movement of the clamp arm 60 by means of an arm and lever function.

In order to provide for bonding, a transducer 72 is shown connected to a bonding tool. The transducer 72 is of a standard type which converts electrical energy to ultrasonic vibrations for purposes of driving the bonding tool for an ultrasonic bond.

FIG. 2 shows the forcer assembly in slightly greater detail with coils 41 and 43 providing for the electrical field to drive the magnet 40 with regard to the bonding tool. The magnetic orientation of the magnets is a pair of magnets which are fundamentally south, north looking at the top and north, south looking at the bottom.

In order to provide for pattern recognition and the format of the way a bond is to be made, an optical system through the Z tube at the upper end is utilized. In particular, a bracket 78 mounts an optical lens which provides for pattern recognition. In order to guide the movement of the light-correctly, a light box 80 is mounted by depending brackets 81 and 83. This provides a wide angle coaxial light source through its opening and then to the optics for pattern recognition and movement of the bonding head over the work to be bonded.

A lower tubular member 84 analogous to tubular member is shown which interconnects the respective flexures and other components.

In order to accommodate the movement of the bonding tool with respect to the transducer, a linear encoder 92 is provided. The linear encoder 92 is such where it encodes the movement of a depending member connected to a transducer bracket.

Looking more specifically at the bond head 10 it can be seen that a tube 98 is leading therefrom having wire 99 extending therefrom. The tube 98 with the wire 99 is connected to the end of the bond head 10 while specifically at the transducer and operating end in the form of assembly 60, 62 and 64.

Figure 3:
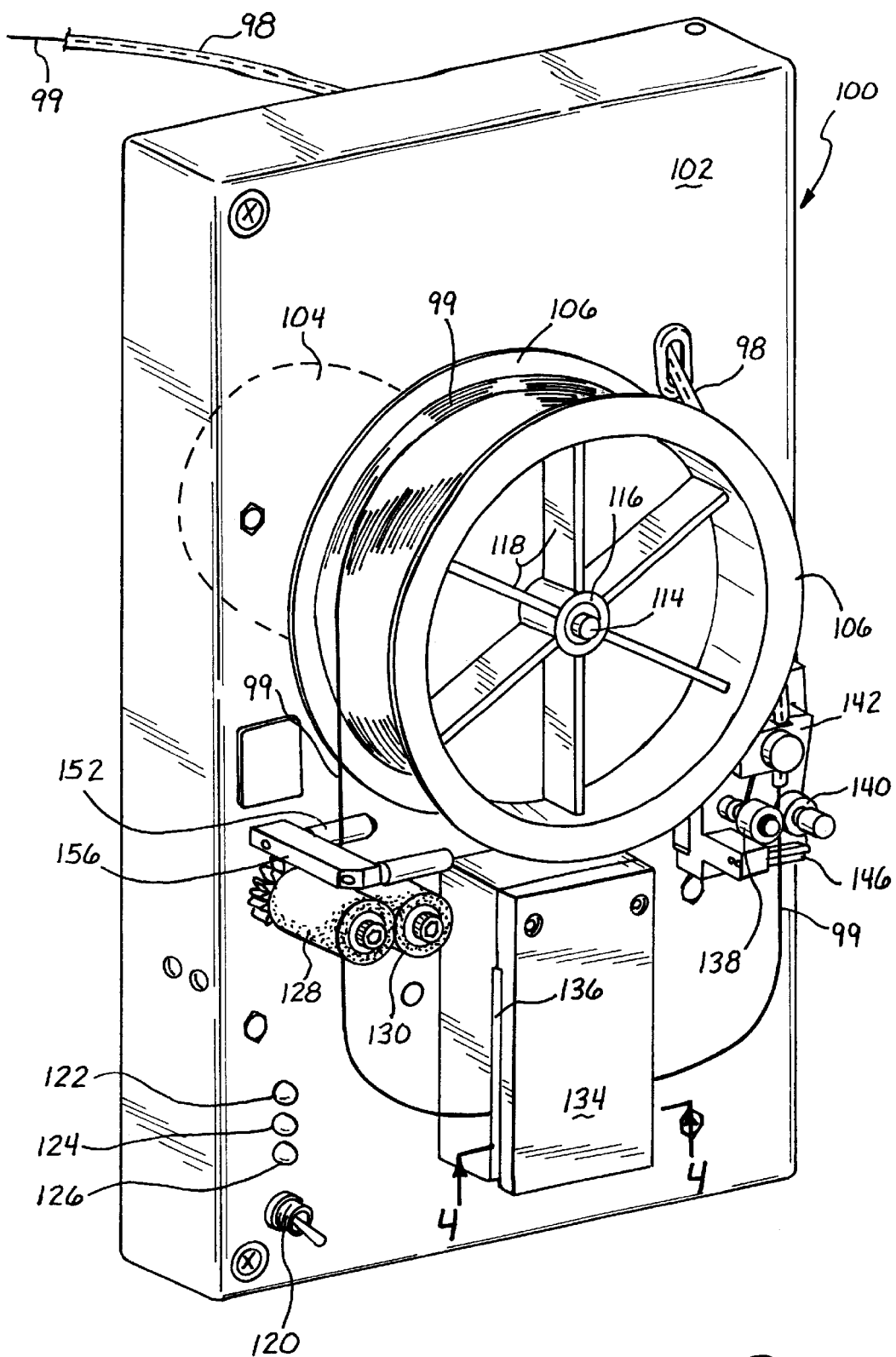
FIG. 3 shows a perspective view of the front and side of the dereeler of the wire bonding spool system incorporating numerous components of the system.

The wire 99 has been fed from a reel by a continuation of the tube 98 as seen in FIG. 3.

FIG. 3 in particular shows a perspective view of the dereeler or wire bonding spool system. The wire bonding spool system is generally designated as wire bonding spool system 100 within a box, cabinet, or container 102. The box, cabinet, or container 102 houses a stepper motor 104 connected to a spool or reel 106. Spool or reel 106 has wire 99 wound thereon which is paid out from the reel or spool as shown.

When the wire 99 is paid out from the spool, it can become crosswise, overlaid, kinked, or bound up within the general winding on the spool 106.

Spool 106 is driven by the motor 104 in an incremental manner. In particular, spool 106 is connected to the motor 104 which is a stepper motor. The motor 104 can be a two phase bi-polar load motor or any other stepper motor which does not spin freely. Also to prevent free spinning of other types of drives, electromotive movement motors, servos or coils, a brake or drag system with the electromotive drive can be utilized.

Fundamentally, what the motor 104 does is it drives the spool 106 on its axial support 114 through the hub 116 thereof connected to spokes 118 in a stepped manner. In this manner, the wire 99 as it is paid off from the spool 106 is stepped out incrementally depending upon usage. The stepping provides for incremental movement so that free running of the spool 106 is avoided. The spool moves in an incremental manner. For every movement, it is then braked by the stepper motor 104 and the increments which are provided in the form of stepped current input.

In order to operate the. wire bonding spool system, a mode switch 120 which can be in any form of switch is shown. The switch 120 can operate the mode from a feed output, auto output, and off. output. When in auto mode the respective lights tight 122, auto 124, and loose 126 indicate the state. This controls the system within the cabinet 102 with respect to the wire 99 as it is fed.

In order to maintain tension on the wire 99, a pair of rollers 128 and 130 are utilized. These respective rollers 128 and 130 are connected to a brushless D.C. motor by a shaft for one of the rollers. Both rollers are geared together by gears that are seen in the other views namely in FIG. 8 and FIG. 9. In order to provide tension on the wire 99 between the spool 106 and the rollers 128 and 130 the rollers are under a constant turning mode, torque, or load when wire is in the sensor. The constant current in the motor provides for a constant torque on the rollers 128 and 130 so that they nip and pull the wire 99 downwardly against the detent action of the stepper motor 104, or braking which holds the spool 106 in its incremental movement phases.

A buffer sensor unit 134 described hereinafter allows the wire 99 to pass therethrough and be oriented within a slot 136 as to its amount of slack or tightness.

The wire 99 is fed after the sensor through a pair of pinch rollers 138 and 140. Pinch roller 140 is connected to a spring biased lever arm 142. The rollers 138 and 140 are both journaled on ball bearings or any other kind of bearing connections. A pair of alignment prongs 146 are shown which align the wire passing through the rollers 138 and 140 that are made of nylon or delrin. Roller 140 is spring biased by a coil spring against roller 138. This allows the rollers 138 and 140 to securely hold the wire passing therethrough and provide guidance.

Roller 138 is connected to an optical or other encoder to determine the length of wire paid out. In this manner, if a bond is not made with the wire, the low inertia optical encoder will sense it. In effect, if the bond head 10 when moving upwardly and downwardly does not pay out wire due to a lack of a bond, this is recorded by the optical encoder connected to the roller 138. Also, the optical encoder determines the amount of wire being used that is fed to the main controls of the system which drives and controls the bond head 10.

In order to guide the wire 99 and maintain it relatively nipped within the length of the rollers 128 and 130 across the width of the spool 106, a pair of rollers, guides, rods, projections, or sleeves 152 and 154 are utilized. These rollers or guides can be made of delrin plastic or other plastic and secured to a bracket 156. The guides 152 and 154 permit the wire 99 to traverse backwardly and forwardly across the spool 106 as the wire 99 is paid off and at the same time keep it within the confines of the nip between the rollers, spools, cylinders, or tubes 128 and 130. Any other suitable guide can be utilized in the form of a fence, arms, guide surfaces, traveling eyelet, and other systems to maintain the feed so that the wire 99 can be tensioned between the rollers 128 and 130.

Figure 8:
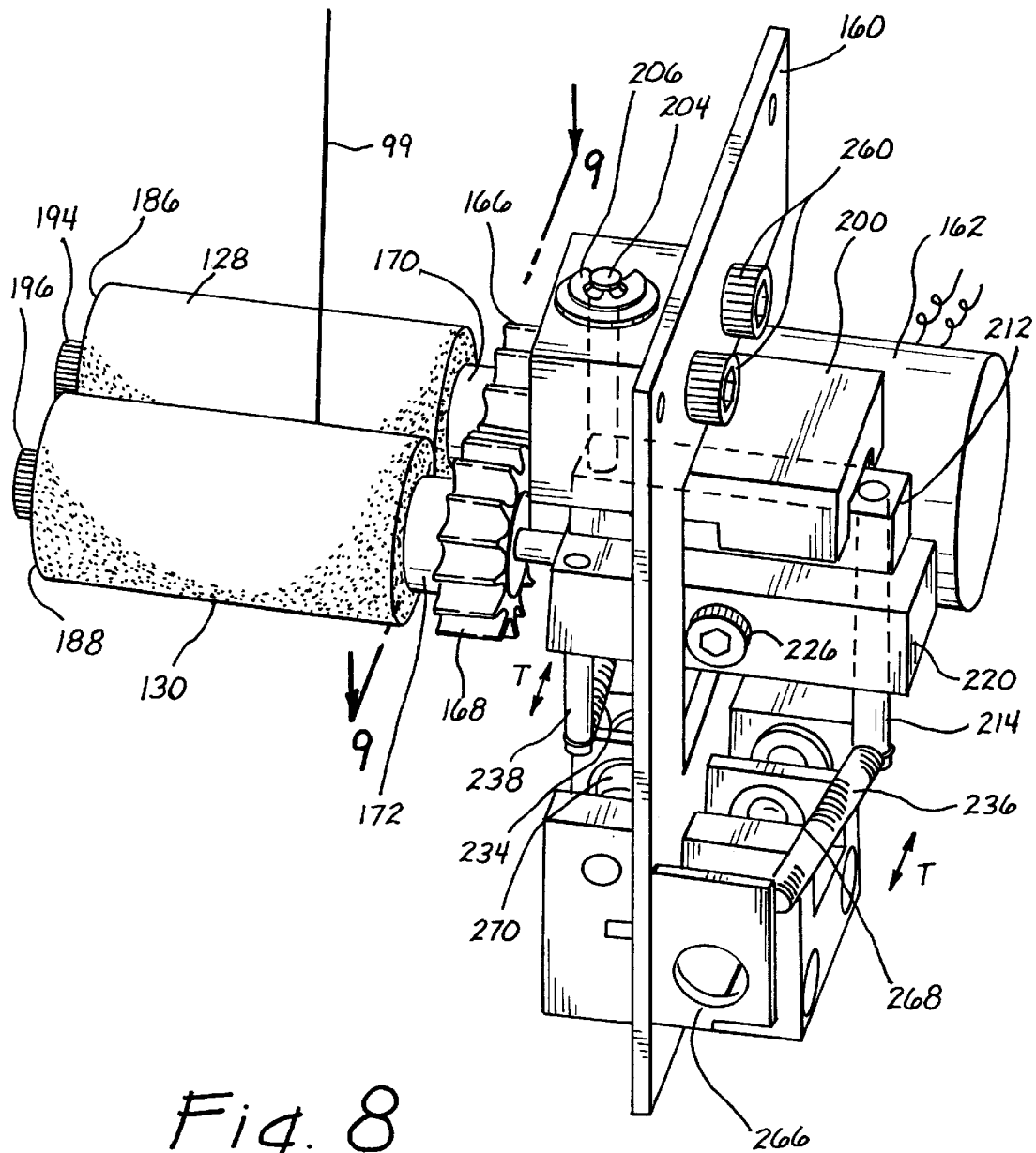
FIG. 8 shows a side perspective view of the system as broken away from the entire system as seen in FIG. 3.
Figure 9:
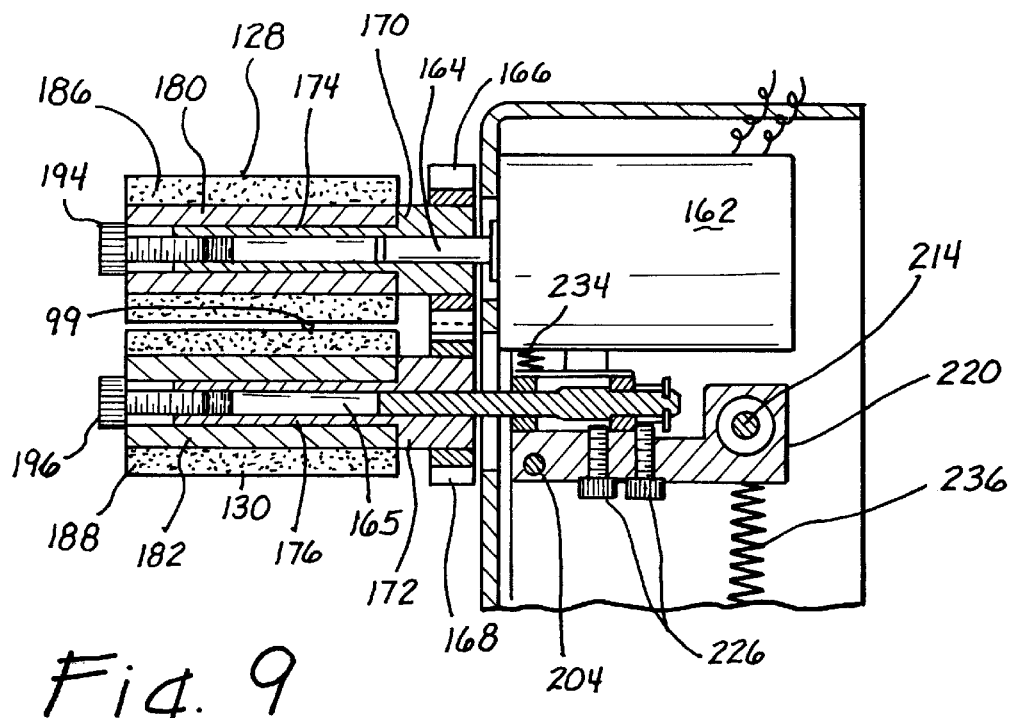
FIG. 9 shows a fragmented sectional view of the tensioning rollers of this invention as sectioned through a portion thereof namely in the direction of lines 9—9 of FIG. 8.
Figure 10:
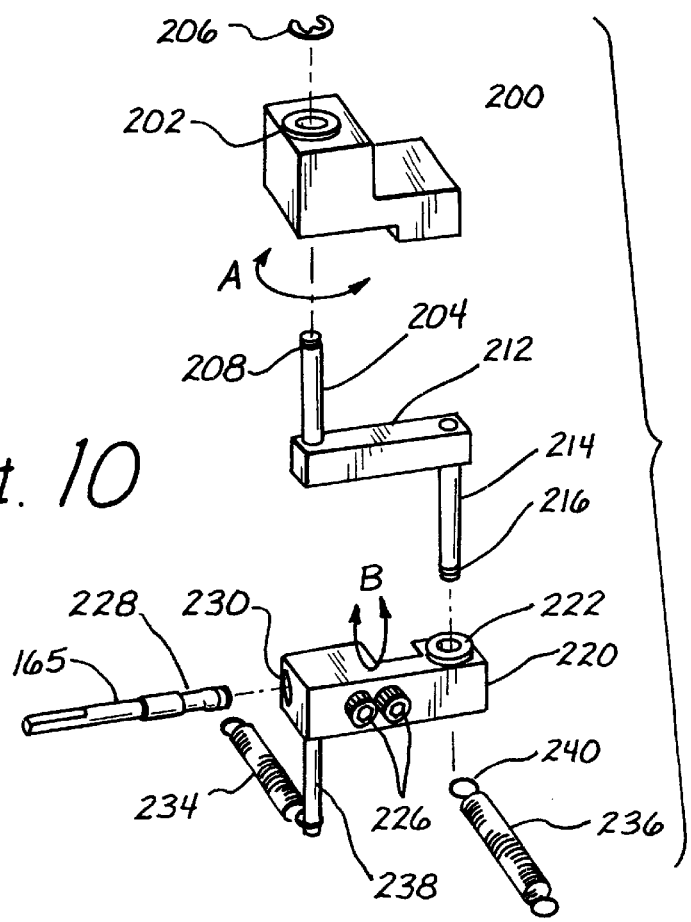
FIG. 10 shows a view of the pivotal movement linkages and force members to maintain the rollers of FIG. 9 in relative parallel relationship to each other.

Looking more particularly at the roller system comprising rollers 128 and 130 they can be seen in FIGS. 8, 9 and 10. FIGS. 8, 9 and 10 show the features of the rollers as they function and as they are driven and supported.

FIG. 8 showing the perspective and fragmented view shows a wall 160 of the cabinet 102. The wall mounts a constant current brushless D.C. motor namely motor 162 that is secured to the wall. Any other stepped electromotive force can also be used to provide torque or tension on the rollers 128 and 130. The brushless D.C. motor 162 has a shaft 164 extending therefrom on which the spool 128 is held. The motor 162 by means of its shaft 164 is also geared by a gear 166 to a second gear 168. These gears 166, and 168 are interconnected so that when the motor 162 turns, it turns the gear train and rollers respectively 128 and 130.

Rollers 128 and 130 are mounted on hubs 170 and 172 having extended shafts therefrom. The hubs 170 and 172 are part of the shafts extending outwardly in the form of shafts 174 and 176. Shafts 174 and 176 serve to hold the mounting cylinders, rods, or connectors 180 and 182 so that a urethane cylindrical foam, sleeve or tubular exterior 186 and 188 can be mounted thereon. The round cylindrical foam, sleeve, or tube 186 and 188 is formed of a foam material that can be a urethane foam having a shore 90A softness. Any other relatively soft material having resilience or limited depression capability can also be used to provide a conformable grip on the wire 99. The foam or resilient material can be any where of approximately 70A to 90A shore. If the material is too soft or too hard the effect of holding the wire 99 in tension can not be accomplished. As can be seen, the wire 99 has been shown interiorly of the foam 186 and 188 in a slightly pinched configuration.

In order to mount the connectors 180 and 182 with the interior hubbed shafts 174 and 176, threaded screws 194 and 196 are utilized. These threaded screws 194 and 196 can be secured with a knurled configuration, a slot screw opening or an allen head type of securement.

The shaft 164 from the motor 162 is in a relatively fixed position. In order to maintain parallelism between the respective rollers 128 and 130, the shaft 165 on which roller 130 is maintained is placed in a virtual load condition to allow for the alignment of the shaft 165 with regard to shaft 164. This is accomplished by a linkage and virtual load system that can be seen in FIGS. 8, 9, and 10. FIG. 10 shows an exploded view of the linkage and virtual load system and the loading elements. These are shown in different orientations with regard to FIGS. 8 and 9 and will be oriented with respect thereto.

Looking more particularly at FIG. 10 it can be seen that a ground block or secure mounting 200 has been shown. The ground block, bearing support, or mounting 200 helps to support the shaft 165 which is virtually loaded for imparting a parallel relationship with the shaft 164. The ground block 200 supports a bearing within an opening 202 so that a pivot shaft, pivot member, or rotatable connector 204 is supported therein. It is fixed from sliding out from the bearing and the opening 202 by a C clamp 206. The C clamp or ring secures the pivot shaft 204 by a notch 208 therein.

The shaft 204 rotates in the block 200 in the circular or arcuate direction of arrow A. As it rotates, it creates in combination with the connected linkage a virtual load on the rollers 128 and 130. This is by way of a cross pivot link, pivotal linkage, pivotal arm, swinging or rotating linkage 212. The pivot link 212 is such where it also supports a second pivot shaft 214 having a groove 216 to receive a spring connection on the opposite side of a moveable block, drive link, support, balance beam, load beam, or load linkage 220. Moveable block 220 load beam or balance beam has an opening 222 through which the shaft 214 passes. Shaft 214 is journaled therein by way of a bearing.

Shaft 165 which supports the roller 130 is seated in the block 220 and held in place by screws 226 securing the shaft 165 therein. Screws 226 drive into a groove 228 in the shaft and securing it in place within the opening 230.

In order to place a load on the load beam 220 forming a virtual load arm a first spring tension load by way of a coil spring 234 is provided. In order to provide movement on the counterbalance side, a spring 236 in the way of a coil tensioning spring is also provided. Spring 234 is attached to a rod, appendage, connection point, or depending member 238 so that the linkage 220 can pivot in the arcuate direction of arrow B. Thus, linkage 220 can rotate around a pivotal basis by virtue of a load provided by the springs 234 and 236. The shaft 214 passing within the bearing 222 is secured to the spring 236 by means of a loop 240 of the spring engaging the groove, notch or opening 216.

The ground block 200 is held by the wall or bracket 160 which is part of the cabinet 102. The ground block 200 is mounted on the wall or bracket 160 by screws 260. These serve to hold the rotating linkage 212 in a manner to allow for the movement in the arcuate direction of arrow A. At the same time this allows the balance beam or balance linkage 220 creating the virtual load to rotate in the arcuate direction of arrow B.

In order to adjust the tension on spring 236, an adjustment plate 266 can be moved by a screw adjustment in the form of a screw 268 that adjusts the tension of the spring 236 inwardly and outwardly. The screw 268 adjusts the movement of the adjustment plate 266 so that it can place greater or lesser tension on the spring 236.

A second screw 270 is also utilized to move a like plate that is hidden, inwardly and outwardly, for adjustment of the spring 234. Thus, tension can be adjusted in the direction of arrows T for the two respective springs 234 and 236.

The foregoing configuration utilizing the arms, linkages, or virtual load beams allows for a pivoting on the ground block 200 as evidenced by the direction of arrows A and B. This allows for parallelism of the two respective shafts 164 and 165. The load provided is such where it maintains the shaft 165 generally in a parallel relationship with shaft 164 along its length. Thus, as the wire 99 moves across the nip between the rollers 128 and 130, the parallel relationship of shaft 164 and 165 keeps a constant tensioning force. The net result of the parallelism is to maintain a uniform gap between the rollers 128 and 130 so as the wire 99 traverses along their length it is maintained smugly between the rollers.

If shafts 164 and 165 were not maintained in parallel, the opening could spread from one end to the other between the rollers 128 and 130. This would create a situation where the wire 99 would not be nipped sufficiently to provide a tensioning load on the wire as it is taken off the spool 106.

It should be understood that as the wire is paid off the spool or reel 106, it traverses across the width of the spool. Accordingly it moves across the length of the rollers 164 and 165 which should be maintained in parallel relationship. Based upon the linkage provided by the pivot linkage 212 and virtual load balance beam 220, a load is maintained provided by springs 234 and 236 against the rollers so that a tensioning and parallelism takes place.

The foregoing parallel loading in concert with the torque provided by motor 162 turning shaft 164 creates a tensioning on the wire 99 that is wound on the spool 106 and coming off the spool. This is based upon the fact that the stepper motor 162 driving the spool is held in a detented or braked position until it is driven to the next step thus maintaining the tension on the wire 99.

The virtual load provided on the rollers 128 and 130 can be created by other linkages. For instance, a linkage for holding shaft 165 in the way of an external balance beam singularly oriented so that a center of moments drives it in a manner to provide the parallel axial orientation of shafts 164 and 165 can also be effected. Also, pressure can be exerted against the shaft 165 by direct spring loading at either end, or other driving means.

It should be born in mind that when such spring loading or external loads takes place, it can create a situation which is cumbersome and clumsy from the standpoint of keeping the shafts 164 and 165 in parallel alignment. With the specific embodiment of this particular invention the aspects of maintaining parallelism are created in a more compact and unencumbered position. As can be understood, a balance point can be achieved by driving through leaf springs, compression springs, or other means against the shaft 165 directly through journaling the shaft on bearings attached to the springs for pushing it. Thus, spring forces of any type can be utilized in a particular configuration for holding the shafts 164 and 165 in parallelism.

The rollers 128 and 130 can be substituted by other tensioning devices for the wire 99 as it is paid off of the spool 106. For instance pinching nips, levers, tongs, arms, or other devices can incrementally pull down the wire 99 from the spool 106 and hold it and then be released for movement of the wire. They can then move along the wire to take up another increment and hold the wire 99 under tension from the spool 106 until further release and paying out of the wire takes place.

Figure 4:
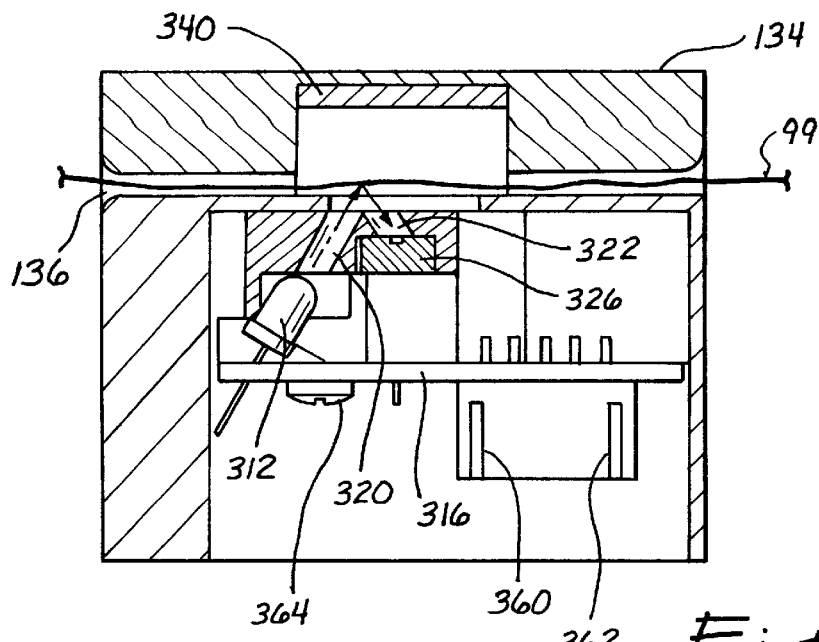
FIG. 4 shows a sectional view in the direction of lines 4—4 of FIG. 3.
Figure 5:
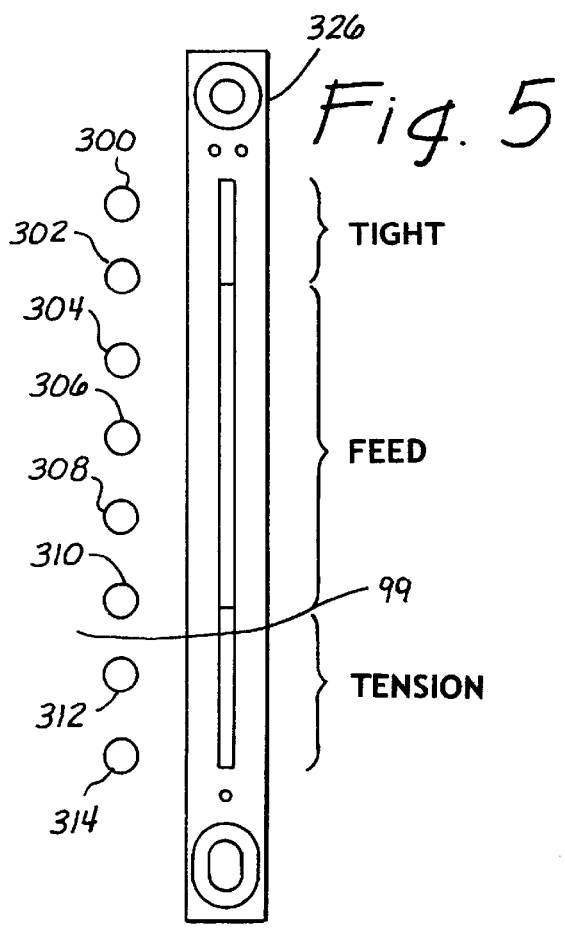
FIG. 5 shows a plan view of the sensor as shown in FIG. 4.
Figure 6:
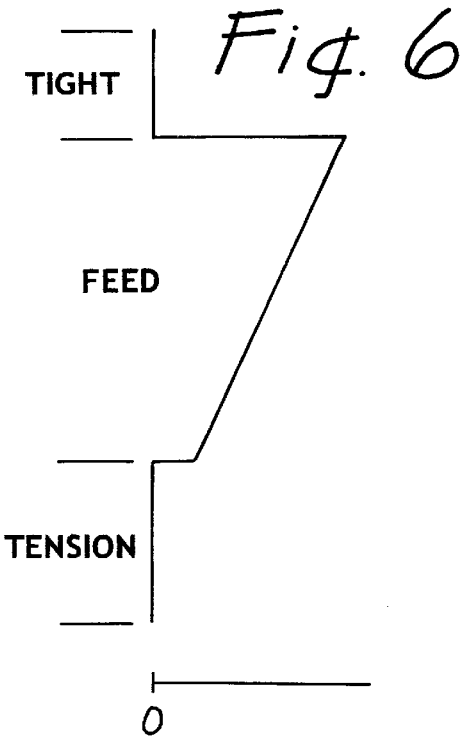
FIG. 6 shows a graphic representation of the analogous positions along the sensor for the respective sensing of tight, feed and tensioning positions of the wire along the sensor.

Looking more specifically at FIGS. 4, 5, and 6, the construction and nature of the buffer sensor 134 can be determined. Specifically, the buffer sensor 134 shown in FIG. 3 is shown sectioned in FIG. 4 along lines 4—4 of FIG. 3. The buffer sensor routes the wire 99 so that it passes through a slot, channel, opening, or aperture 136 that is relatively elongate but can be in other forms as long as the wire is allowed to traverse and be sensed in a certain area.

The buffer sensor 134 allows for the right amount of wire 99 to be placed into the system so that there is sufficient slack and at the same time diminishing a tightened feed of the wire as it passes down to the bonding head 10. With a constant movement of the bonding head 10 paying out the wire 99 at the working end thereof underneath the bonding tool, more wire needs to be fed out. When various speeds of bonding or various orientations of bonding take place, feed of the wire 99 must be adjusted thereto. To provide the feed of the wire 99, the buffer sensor 134 senses the placement of the wire in its overall slack or tightened relationship.

In order for the system to provide wire 99 to the bonder head 10 quickly-enough, the buffer loop region is used. For the correct amount of wire 99 in the buffer 134, the system needs to sense how much wire is in the buffer loop region.

The buffer 134 comprises the passage groove or slot 136 for the wire 99 to pass through so that it can be sensed as to its relative position. In order to accomplish this, a series of light emitting diodes (LED'S) are utilized. These are seen in FIG. 5 as LED's 300, 302, 304, 306, 308, 310, 312, and 314.

It can be seen in FIG. 4 that LED 312 has been shown with its connection and mounted on a bracket or board 316. The LED's 300 through 314 cast their light through a slot 320. The light is reflected off of the wire 99 through a second slot 322 to a photo sensitive silicon sensor 326. The sensor 326 can be any type of photo electric sensor to sense the position of a wire at a certain location and then provide a reading as to such location. The sensing is along the length of the photo diode silicon sensor 326 so that a determination of where the wire lies along the slot 136 can be determined.

In order to avoid ambient light from affecting the reading of the position of the wire 99, a defuser 340 is utilized. The defuser 340 defuses the light so that the reflection off of the wire 99 is the peak portion of light that is reflected back into the slot 322 and the silicon sensor 326. The defuser 340 is such where it permits only a limited amount of light to be returned. The defuser 340 is made of an anti-static conductive material of long chain polymers which absorb light. Any other type of defuser can be used for defuser 340 in order to effect the same light absorption. The goal is that light from the LED's 300 through 314 is mainly reflected from the wire 99 so that its position along the length of the sensor 326 can be determined.

When looking at FIG. 5 it can be seen that the wire 99 whenever it is crossing a particular area of sensor 134 is read along the silicon sensor 326. The particular position of the wire 99 shown in FIG. 5 as it relates to the other showings is such where there is tension provided by the tensioner torque reeler rollers 128 and 130 with sufficient slack to be able to draw wire 99 in sufficient amounts to the bond head 10. The positioning of wire 99 along slot 136 is such where there is a position wherein the wire is being pulled in the feed region. When it is drawn out significantly, it passes into the tension area where tension is maintained by rollers 128 and 130. The wire 99 when fed by the reel 106 turning and the rollers 128 and 130 continuing to turn allows the wire 99 to be fed and provide for slack in the lower portion of slot 136. The speed of feed is along the slope as seen in FIG. 6. This enables the wire 99 to be brought to a point where it is of sufficient length. Of course, when the wire is in the tight region, it signals the controller to stop the spool motor, and indicate to the user with light 122, the tight condition. Since the stepper motor 104 feeding the wire 99 initially is stepped, there is a slight pause which is shown before the slope of feed starts to rise. When referring to the tension region reference is to the rollers 128 and 130 tensioning the wire from the spool 106 which is braked by its stepper motor 104.

In order to maintain the connection of the buffer 134, connection points 360 and 362 are utilized. In order to hold the entire assembly together, a screw 364 secures the assembly into position.

Figure 7:
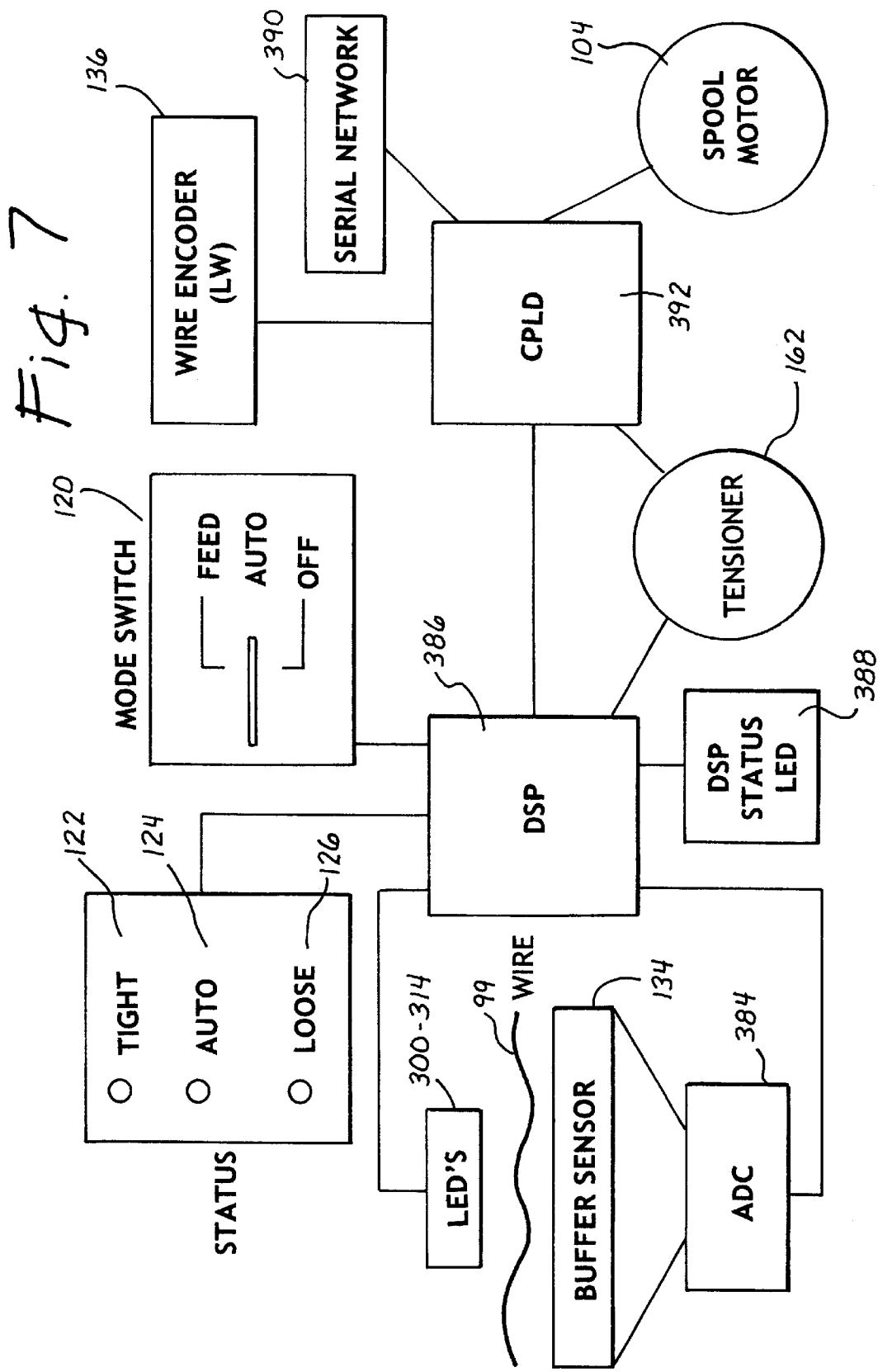
FIG. 7 shows a diagram of the logic of the system for controlling the movement of the feed system.

Looking more specifically at FIG. 7, it can be seen how the controls for the entire system are utilized. As previously stated there is a mode switch 120 where feed and auto control as well as an off position are selected. A status readout 122, 124, and 126 is provided showing the tight position, the auto position, and the loose position respectively corresponding to the position of the wire 99 in the sensor 134 as well as the switch 120 state.

The output of the buffer sensor 134 is sent to an analog to digital converter (ADC) 384 which converts the signal of the position of the wire along the buffer sensor 134. It is then sent to the digital signal processor (DSP) 386 for processing and driving the motor 104 for further feed. The DSP 386 state has its status indicated by status LED's 122, 124, and 126.

The serial network 390 is part of the entire system for allowing the programmable logic device 392 in conjunction with the DSP 386 to drive the spool motor 104 as well as maintain the tensioner in its proper position all in light of the wire 99 position as read through the buffer sensor 134.

Alternative sensors, locations, and orientations can be utilized to show the position of the wire 99 along the length of the buffer sensor 134 or in relation to any sensor. Such items as optical encoders, position indicators, sensors, in the way of contactors, or electrical bridge elements can be utilized for an output to an analog to digital converter or other output devices to provide information to the digital signal processor 386 for overall control of the wire 99 being fed.

What is claimed is:

1. An ultrasonic wire bonder comprising:

a bonding head with an ultrasonic wire bonding tool for bonding wire paid out from a reel to an electrical component;

an electric drive for rotating said reel;

a tensioner comprising at least one roller and a second surface for providing tension by said roller contacting and nipping the wire between said second surface and said roller for creating positive tension in wire from said reel; and, an electromotive drive for driving said tensioner in order to tension wire being paid out from said reel.

2. The ultrasonic wire bonder as claimed in claim 1 wherein:

said electric drive is a motor.

3. The ultrasonic wire bonder as claimed in claim 1 wherein:

said tensioner comprises two rollers for pulling wire therebetween.

4. The ultrasonic wire bonder as claimed in claim 1 wherein:

said electric drive for said reel comprises a stepper motor for driving said reel.

5. The ultrasonic wire bonder as claimed in claim 3 further comprising:

a linkage for holding one of said rollers substantially-parallel to the second along its length.

6. The ultrasonic wire bonder as claimed in claim 5 wherein said linkage comprises:

a pair of interconnected pivotal links having a spring force on at least one of said links for moving a roller to which it is connected into parallel relationship to the second roller.

7. The ultrasonic wire bonder as claimed in claim 1 further comprising:

a sensor for sensing an amount of wire within a zone between the reel and the bonding head; and, a controller connected to said sensor for causing said reel to release wire to said tensioner.

8. The ultrasonic wire bonder as claimed in claim 7 further comprising:

said sensor having an optical sensor and a light source to sense reflected light from a position of the wire in relationship to said sensor.

9. A wire dereeler for an ultrasonic wire bonder comprising:

a drive for driving a reel of wire to be bonded;

a tensioner to maintain tension on the wire being paid off of the reel;

a sensor comprising a light source and a photoelectric sensor for sensing light from said wire with respect to a particular position for sensing a given amount of wire; and, a controller for controlling said drive based upon the amount of wire sensed.

10. The wire dereeler as claimed in claim 9 wherein:

said tensioner comprises at least two rollers connected to a drive for pulling a wire nipped between them.

11. The wire dereeler as claimed in claim 9 wherein:

said photoelectric sensor is elongate for sensing the position of wire along its length.

12. The wire dereeler as claimed in claim 9 further comprising:

a pair of guide rollers through which the wire passes that are spring biased against each other; and, an encoder connected to one of said guide rollers for encoding the amount of wire passing through said guide rollers.

13. The wire dereeler as claimed in claim 10 wherein:

said rollers have a resilient surface for nipping wire passing therebetween.

14. A wire dereeler for an ultrasonic wire bonder with a bond head comprising:

a support for supporting a reel of wire to be bonded;

a stepper motor for driving said reel in incremental steps;

at least two rollers for receiving wire from said reel therebetween;

a motor for driving at least one of said rollers and tensioning wire placed between said rollers;

a linkage for aligning said rollers substantially in parallel;

a photoelectric sensor for determining an amount of wire at a position between the bond head and said rollers; and, a controller for controlling said stepper motor driving said reel.

15. The wire dereeler as claimed in claim 14 further comprising:

said photoelectric sensor being an elongated photo sensitive silicon sensor.

16. The wire dereeler as claimed in claim 14 wherein said linkage comprises:

at least one balance beam to which at least one roller is supported having at least one spring biasing force to move said roller axis into spring biased aligned parallel relationship with the other roller.

17. The wire dereeler as claimed in claim 14 wherein:

said balance beam is supported on a pivotal link.

18. A method for dereeling wire for an ultrasonic wire bonder having a bond head comprising:

supporting a reel of wire for bonding purposes;

driving said reel in stepped increments;

tensioning said wire from said reel by at least two rollers through which the wire passes;

torquing said rollers with wire therebetween;

sensing an amount of wire to be fed to'said bond head by a photoelectric sensor; and, controlling the amount of wire from said reel in response to the amount of wire sensed.

19. The method as claimed in claim 18 further comprising:

maintaining said at least two rollers in parallel relationship by a spring biased linkage.

20. The method as claimed in claim 18 further comprising:

driving said reel by a stepper motor.

21. The method as claimed in claim 18 wherein:

said rollers are torqued by a motor drive under a rotating force.

22. The method as claimed in claim 18 wherein:

said photoelectric sensor comprises a photo sensitive silicon sensor for sensing light cast upon wire passing thereby; and, providing a signal from said sensor based upon the position of the wire with respect to the sensor.

* * * * *